(12) United States Patent
Kim (10) Patent No.: US 10,020,648 B2
(45) Date of Patent: Jul. 10, 2018

(54) APPARATUS FOR DETECTING MALFUNCTION OF RELAY

(71) Applicant: LSIS CO., LTD., Gyeonggi-do (KR)

(72) Inventor: Jong-Chan Kim, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/359,057

(22) Filed: Nov. 22, 2016

(65) Prior Publication Data
US 2017/0317487 A1 Nov. 2, 2017

(30) Foreign Application Priority Data
Apr. 27, 2016 (KR) .................. 10-2016-0051499

(51) Int. Cl.
*G01R 15/16* (2006.01)
*H02H 3/32* (2006.01)
(Continued)

(52) U.S. Cl.
CPC .......... *H02H 3/325* (2013.01); *G01R 31/3278* (2013.01); *G01R 31/40* (2013.01);
(Continued)

(58) Field of Classification Search
CPC .............. G01R 27/2605; G01R 31/028; G01R 31/3278; G01R 15/16; G01R 31/42; G01R 19/0084; G01R 27/26
(Continued)

(56) References Cited

U.S. PATENT DOCUMENTS 3,327,167 A * 6/1967 Schaefer ............... H02H 7/085
361/103
3,656,158 A * 4/1972 Goodwater ........... G08B 17/06
340/288
(Continued)

FOREIGN PATENT DOCUMENTS

JP 6-41396 U 5/1994
JP 2000-184584 A 6/2000
(Continued)

OTHER PUBLICATIONS

European Search Report dated Jul. 11, 2017 in corresponding European Patent Application No. 16193058.1.
(Continued)

*Primary Examiner* — Jermele M Hollington
*Assistant Examiner* — Taqi Nasir
(74) *Attorney, Agent, or Firm* — K&L Gates LLP (57) ABSTRACT

The present disclosure relates to an apparatus for detecting malfunction of a relay, which includes a temperature determination unit configured to determine whether or not a relay resistor is overheated based on a resistance temperature of the relay resistor being connected to a relay; a charging voltage determination unit configured to determine whether or not a variation value of a charging voltage of a direct current (DC) link capacitor according to an operation start of an inverter system exceeds a reference variation value; and a relay malfunction determination unit configured to determine whether or not the relay is malfunctioned based on one or more the determination results whether or not the relay resistor is overheated and whether or not the variation value exceeds the reference variation value.

14 Claims, 6 Drawing Sheets

(51) Int. Cl.
*G01R 31/327* (2006.01)
*G01R 31/40* (2014.01)
*H01H 47/00* (2006.01)
*H02K 11/33* (2016.01)
*H02P 29/032* (2016.01)
*H02H 5/04* (2006.01)
*H02P 27/08* (2006.01)

(52) U.S. Cl.
CPC .......... *H01H 47/002* (2013.01); *H02H 5/042* (2013.01); *H02K 11/33* (2016.01); *H02P 27/08* (2013.01); *H02P 29/032* (2016.02)

(58) Field of Classification Search
USPC ..... 324/418, 382, 519, 750.17, 754.28, 548, 324/658, 686
See application file for complete search history.

(56) References Cited

U.S. PATENT DOCUMENTS

| | | | | |
|---|---|---|---|---|
| 6,909,285 | B2* | 6/2005 | Jordan | G01R 31/3278 324/382 |
| 9,166,514 | B2 | 10/2015 | Niwa et al. | |
| 2004/0047097 | A1 | 3/2004 | Thomas et al. | |
| 2004/0085071 | A1* | 5/2004 | Sankey | G01R 31/3278 324/418 |
| 2005/0104597 | A1* | 5/2005 | Klijn | G01R 31/3278 324/418 |
| 2007/0115604 | A1 | 5/2007 | Zettel et al. | |
| 2008/0079417 | A1* | 4/2008 | Viitanen | H02P 6/182 324/76.53 |
| 2008/0157775 | A1* | 7/2008 | Finney | G01R 31/3277 324/418 |
| 2010/0085060 | A1 | 4/2010 | Ichikawa et al. | |
| 2011/0254557 | A1* | 10/2011 | Makki | G01R 31/3274 324/418 |
| 2013/0256550 | A1* | 10/2013 | McCormick | G01R 19/0023 250/374 |
| 2013/0314012 | A1 | 11/2013 | Cho | |
| 2015/0062986 | A1* | 3/2015 | Park | H02M 1/4208 363/89 |
| 2015/0131343 | A1* | 5/2015 | Hufnagel | H02M 1/42 363/49 |
| 2015/0346282 | A1* | 12/2015 | Jeon | G01R 31/3278 324/418 |

FOREIGN PATENT DOCUMENTS

| | | | | |
|---|---|---|---|---|
| JP | 2000184584 | A * | 6/2000 | ............ H02H 7/122 |
| JP | 2006-262616 | A | 9/2006 | |
| JP | 2008-135321 | A | 6/2008 | |
| JP | 2012-120376 | A | 6/2012 | |
| JP | 2012120376 | A * | 6/2012 | ............ H02M 7/06 |
| JP | 2012-186980 | A | 9/2012 | |
| JP | 5712950 | B2 | 5/2015 | |
| JP | 2015-125324 | A | 7/2015 | |
| KR | 10-0184799 | B1 | 5/1999 | |
| KR | 10-2013-0096481 | A | 8/2013 | |

OTHER PUBLICATIONS

Japanese Office Action dated Aug. 29, 2017 in connection with the counterpart Japanese Patent Application.

* cited by examiner

FIG 3

PRIOR ART

APPARATUS FOR DETECTING MALFUNCTION OF RELAY

CROSS REFERENCE TO RELATED APPLICATION

This application claims the benefit of Korean Patent Application No. 10-2016-0051499, filed on Apr. 27, 2016, entitled "APPARATUS FOR DETECTING MALFUNCTION OF RELAY", which is hereby incorporated by reference in its entirety into this application.

BACKGROUND

1. Technical Field

The present disclosure relates to an apparatus for detecting malfunction of a relay, and more particularly, to an apparatus for detecting malfunction of a relay, which detects malfunction of a relay based on a variation value of a charging voltage of a direct current (DC) link capacitor and resistance temperature of a relay resistor according to an operation start of an inverter system.

2. Description of the Related Art

Generally, an inverter system has been widely used in a variety of industrial fields across from a motor application field to various electronic equipment fields and the like. Such an inverter system typically generates an alternating current (AC) voltage by switching a direct current (DC) voltage according to a pulse width modulation (PWM) signal using an insulated gate bipolar transistor (IGBT) that is a switching device.

Ultimately, the inverter system may supply an AC voltage of a voltage and a frequency desired by a user to a load, thereby accurately controlling a driving of electronic equipment such as a motor.

Figure 1:
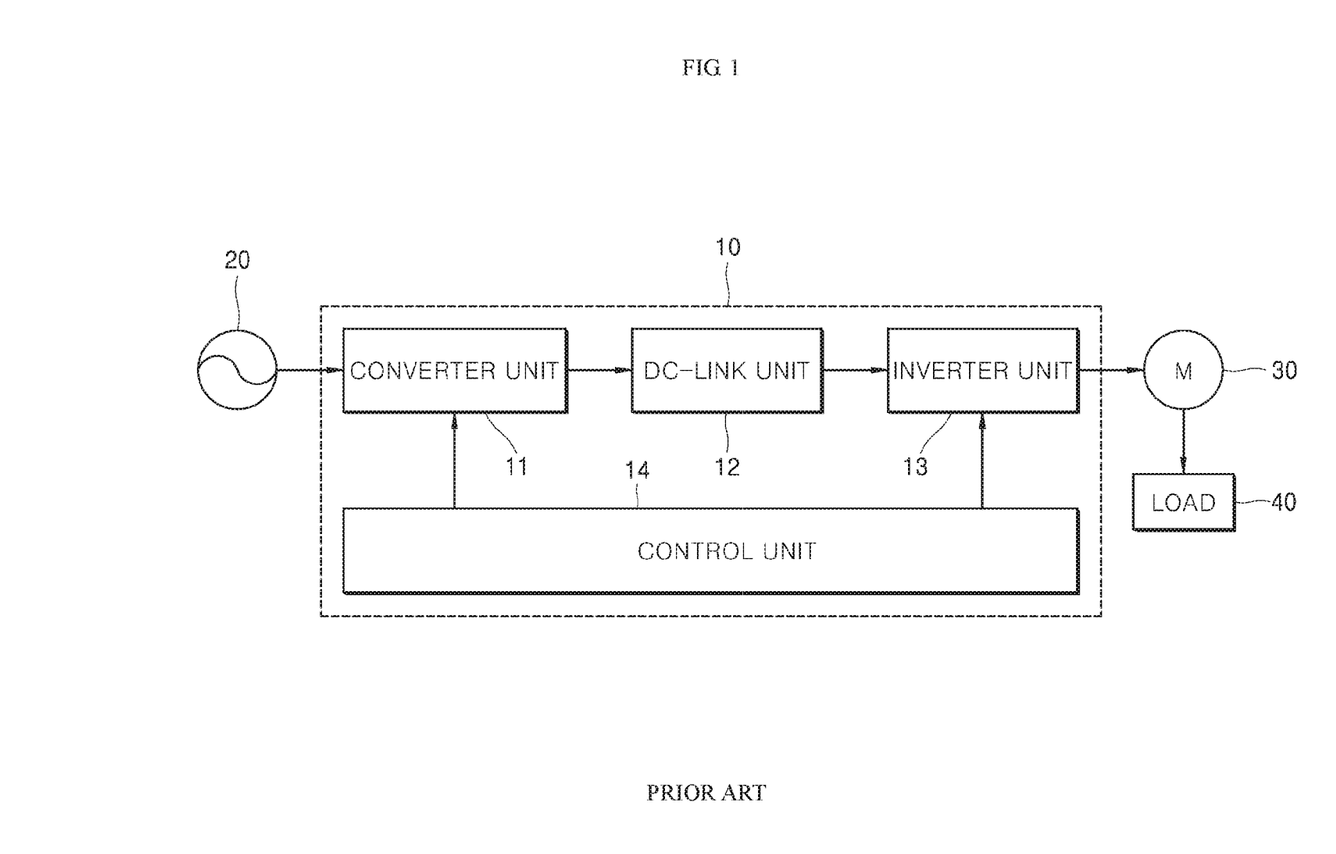
FIG. 1 is a diagram illustrating a configuration of a conventional inverter system.
Figure 2:
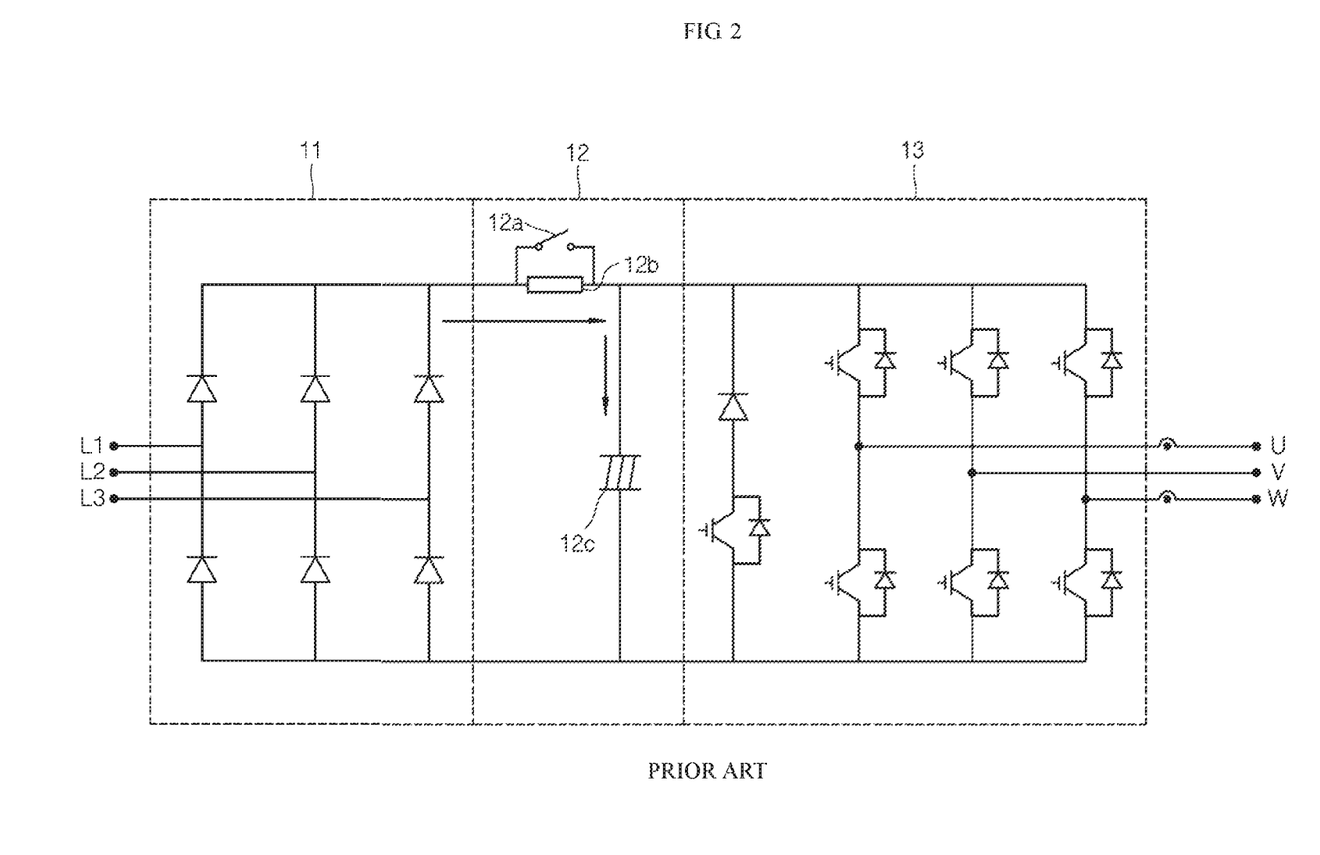
FIG. 2 is a circuit diagram of the inverter system when a relay is operated to be turned off.
Figure 3:
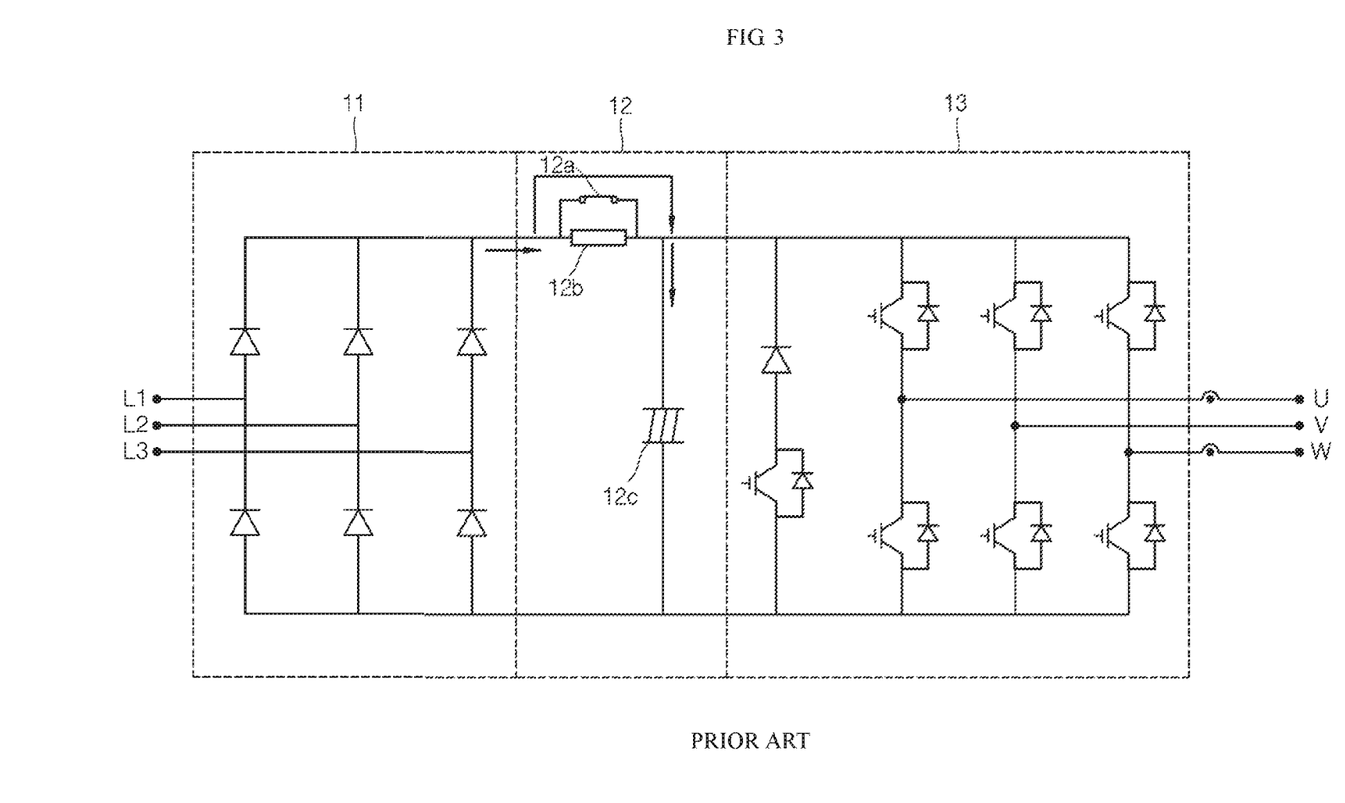

FIG. 1 is a diagram illustrating a configuration of a conventional inverter system 10, FIG. 2 is a circuit diagram of the conventional inverter system 10 when a relay 12a is operated to be turned off, and FIG. 3 is a circuit diagram of the conventional inverter system 10 when the relay 12a is operated to be turned on.

With reference to FIGS. 1 to 3, the inverter system 10 is a power conversion apparatus which receives AC power from a mains electricity supply 20 and varies a voltage and a frequency thereof to control a speed of an electric motor 30 that drives a load 40.

The electric motor 30 being controlled by the inverter system 10 drives the load 40 that is used in environments of energy reduction and an industrial automation such as a fan, a pump, an elevator, a conveyer, a production line and the like.

For this purpose, the inverter system 10 is configured with a converter unit 11, a DC link unit 12, an inverter unit 13, and a control unit 14.

For power conversion, the converter unit 11 converts AC power received from the mains electricity supply 20 into DC power. More specifically, the converter unit 11 is configured with a plurality of diode rectifying circuits and receives the AC power from the mains electricity supply 20 to generate the DC power including a ripple component.

The inverter unit 13 again converts the DC power stored in the DC link unit 12 into AC power for operating the electric motor 30. More specifically, the inverter unit 13 is configured with a combination of IGBT modules, and outputs the DC power, which is charged in a DC link capacitor 12c, as AC power having a constant voltage and a constant frequency according to a PWM control signal of the control unit 14.

The control unit 14 controls the converter unit 11 and the inverter unit 13 to control a power conversion and a power output. More particularly, the control unit 14 performs control and protection functions so as to enable the converter unit 11, the DC link unit 12, and the inverter unit 13 to smoothly perform their functions and operations which are described above.

For this purpose, the control unit 14 performs an operation processing on control and protection algorithms and monitors a current, a voltage and the like, thereby sensing an abnormal operation. Also, the control unit 14 transmits a control signal to the IGBT modules of the inverter unit 13, and provides a user with operation status information of the inverter system 10.

The DC link unit 12 stores the DC power that has been converted from the converter unit 11. More particularly, the DC link unit 12 is configured with a relay 12a, a relay resistor 12b, and a DC link capacitor 12c.

SUMMARY

An object of the present disclosure is to prevent the heating and burning of a relay resistor and an output degradation of an inverter system due to a drop voltage generated at the relay resistor by detecting malfunction of a relay based on a variation value of a charging voltage of a direct current (DC) link capacitor according to an operation start of the inverter system and a resistance temperature of the relay resistor.

The object of the present disclosure is not limited to the above described object, and other objects and advantages not mentioned above will be understood in the art from the following description and also will be apparently understood by an embodiment of the present disclosure. Also, it will be easily understood that the object and advantages of the present disclosure described herein may be implemented by means and a combination thereof defined by the appended claims.

To attain such an object described above, an apparatus for detecting malfunction of a relay, which detects malfunction of a relay connected to a direct current (DC) link capacitor so as to block an overcurrent being generated when an operation of an inverter system starts, includes a temperature determination unit configured to determine whether or not a relay resistor is overheated based on a resistance temperature of the relay resistor being connected to the relay; a charging voltage determination unit configured to determine whether or not a variation value of a charging voltage of the DC link capacitor according to the operation start of the inverter system exceeds a reference variation value; and a relay malfunction determination unit configured to determine whether or not the relay is malfunctioned based on one or more the determination results whether or not the relay resistor is overheated and whether or not the variation value exceeds the reference variation value.

In accordance with the present disclosure as described above, there is provided an effect capable of preventing the heating and burning of a relay resistor and an output degradation of an inverter system due to a drop voltage generated at the relay resistor by detecting malfunction of a relay based on a variation value of a charging voltage of a direct current (DC) link capacitor according to an operation start of the inverter system and a resistance temperature of the relay resistor.

BRIEF DESCRIPTION OF DRAWINGS

FIG. 3 is a circuit diagram of the inverter system when the relay is operated to be turned on.

DETAILED DESCRIPTION

The above and other objects, features and advantages of the present disclosure will be described later in detail with reference to the accompanying drawings, and thus the technical spirit of the present disclosure can be easily implemented by those skilled in the art. In the following description of the present disclosure, if a detailed description of known configurations and functions is determined to obscure the interpretation of embodiments of the present disclosure, the detailed description thereof will be omitted. Hereinafter, preferred embodiments according to the present disclosure will be described in detail with reference to the accompanying drawings. In the drawings, the same reference numerals refer to the same or similar elements throughout.

Figure 4:
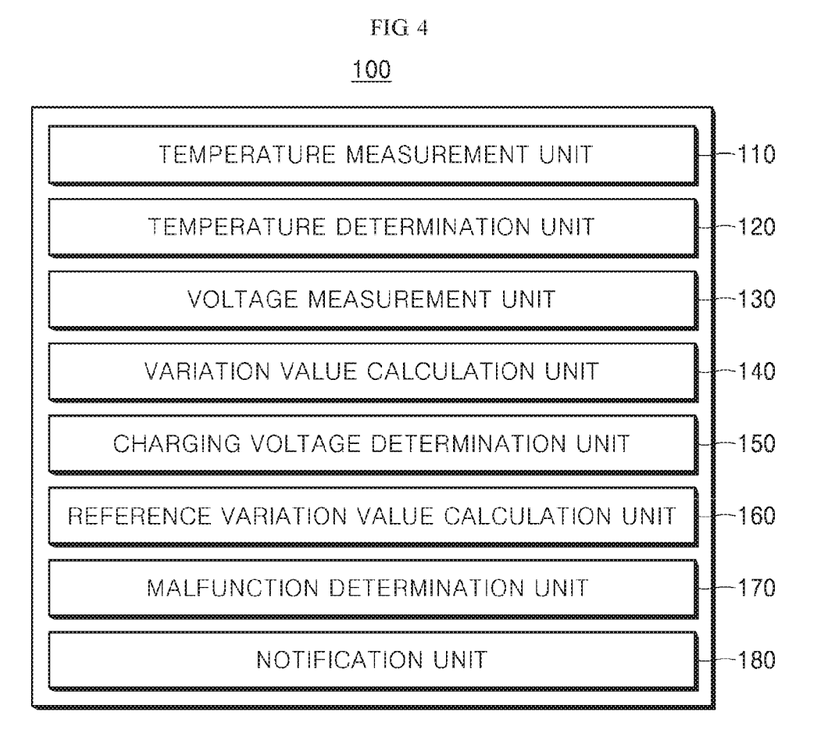
FIG. 4 is a diagram illustrating a configuration of an apparatus for detecting malfunction of a relay according to one embodiment of the present disclosure.
Figure 5:
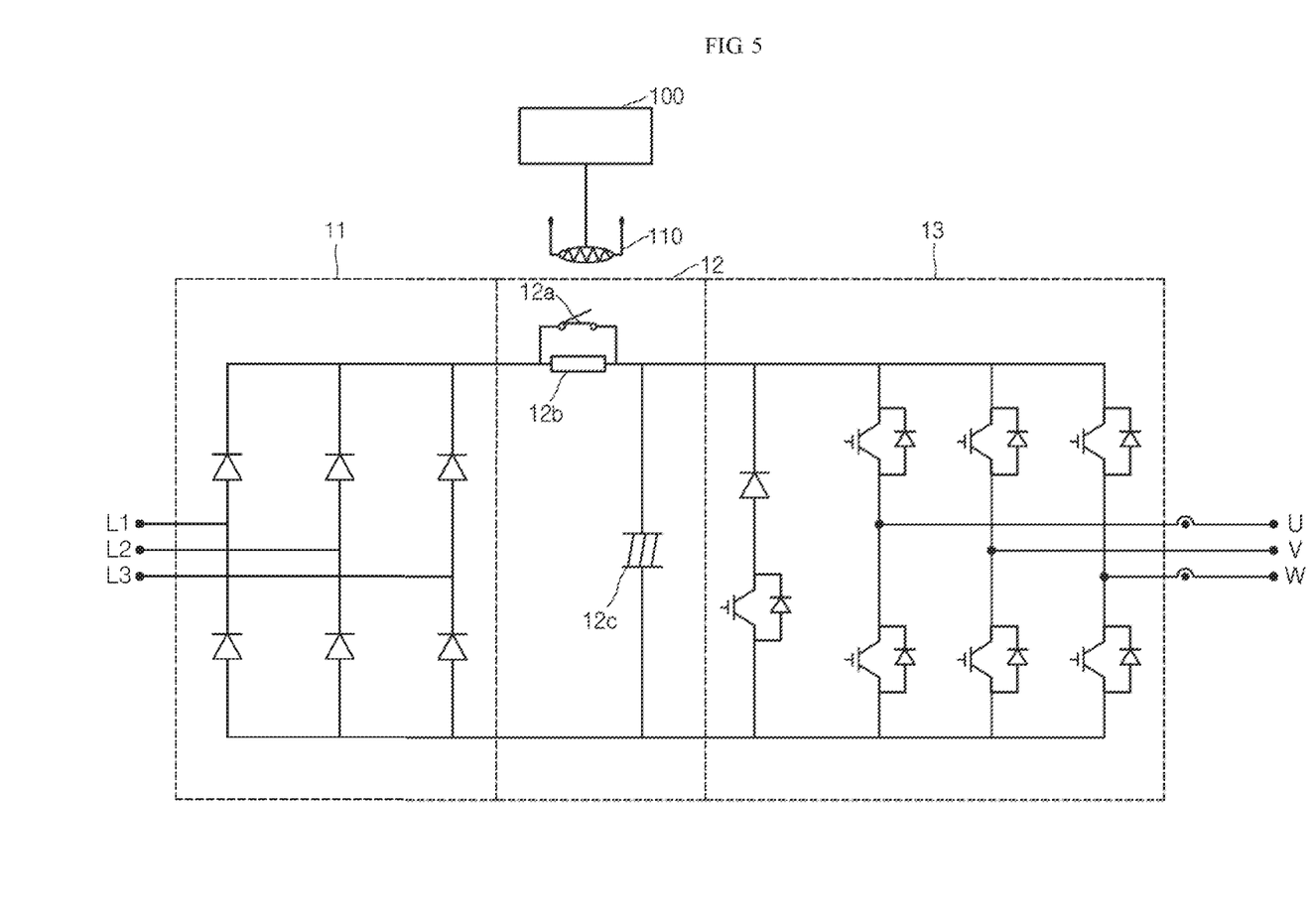
FIG. 5 is a circuit diagram of an inverter system provided with the apparatus for detecting malfunction of a relay according to one embodiment of the present disclosure.

FIG. 4 is a diagram illustrating a configuration of an apparatus 100 for detecting malfunction of a relay according to one embodiment of the present disclosure, and FIG. 5 is a circuit diagram of an inverter system provided with the apparatus 100 for detecting malfunction of a relay according to one embodiment of the present disclosure.

With reference to FIGS. 4 and 5, an inverter system, which is provided with an apparatus for detecting malfunction of a relay according to one embodiment of the present disclosure, may include a converter unit 11, a direct current (DC) link unit 12, an inverter unit 13, and a control unit 14 shown in FIG. 1.

For a power conversion, the converter unit 11 may convert alternating current (AC) power received from a mains electricity supply 20 into DC power.

The DC link unit 12 may store therein the DC power converted from the converter unit 11.

The inverter unit 13 may again convert the DC power stored in the DC link unit 12 into AC power so as to operate an electric motor.

The control unit 14 shown in FIG. 1 may control the converter unit 11 and the inverter unit 13 to control a power conversion and a power output.

More particularly, the DC link unit 12 may include a relay 12a, a relay resistor 12b, and a DC link capacitor 12c.

Here, an apparatus 100 for detecting malfunction of a relay according to one embodiment of the present disclosure may detect malfunction of the relay 12a based on a variation value of a charging voltage of the DC link capacitor 12c and a resistance temperature of the relay resistor 12b according to an operation start of an inverter system.

For this purpose, the apparatus 100 for detecting malfunction of a relay according to one embodiment of the present disclosure may include a temperature measurement unit 110, a temperature determination unit 120, a voltage measurement unit 130, a variation value calculation unit 140, a charging voltage determination unit 150, a reference variation value calculation unit 160, a malfunction determination unit 170, and a notification unit 180.

The temperature measurement unit 110 may measure a resistance temperature that increases at the relay resistor 12b due to a current flowing at the relay resistor 12b.

For this purpose, the temperature measurement unit 110 may measure a resistance temperature of the relay resistor 12b using a negative temperature coefficient (NTC) thermistor that is located in the vicinity of the relay resistor 12b and varies its resistance value according to a resistance temperature.

Here, the NTC thermistor is a thermistor that reversely varies its resistance value with respect to an ambient temperature variation, and thus has a characteristic in which a resistance value is decreased when an ambient temperature is raised, whereas the resistance value is increased when the ambient temperature is dropped.

Meanwhile, a temperature measurement unit 110 according to another embodiment may measure a resistance temperature of the relay resistor 12b after a preset measurement start time from a time when an operation of the inverter system 10 starts.

In other words, the temperature measurement unit 110 according to another embodiment measures the resistance temperature of the relay resistor 12b when a preset measurement start time passes after an operation of the inverter system 10 has started.

Through such a process, the temperature measurement unit 110 according to another embodiment may not perform an unnecessary temperature measurement at an operation start time of the inverter system 10 at which a resistance temperature of the relay resistor 12b is a low temperature.

The temperature determination unit 120 may determine whether or not the relay resistor 12b is overheated based on the resistance temperature of the relay resistor 12b, which is measured from the temperature measurement unit 110.

More particularly, the temperature determination unit 120 may compare the resistance temperature with a preset reference temperature value and determine that the relay resistor 12b is overheated when the resistance temperature exceeds the preset reference temperature value as the comparison result.

Contrarily, the temperature determination unit 120 may determine that the relay resistor 12b is not overheated when the resistance temperature does not exceed the preset reference temperature value as the comparison result of the resistance temperature and the preset reference temperature value.

The temperature determination unit 120 may transmit the determination result of a status of the relay resistor 12b being overheated or not as described above to the malfunction determination unit 170 to be described later.

The voltage measurement unit 130 may serve to measure a charging voltage of the DC link capacitor 12c.

For this purpose, the voltage measurement unit 130 may include a voltage measurement sensor for measuring a capacitor voltage.

Meanwhile, before an operation start of the inverter system, that is, when the inverter system is not operating, the voltage measurement unit 130 may measure a charging voltage of the DC link capacitor 12c as a first charging voltage.

Also, the voltage measurement unit 130 may measure a charging voltage of the DC link capacitor 12c as a second charging voltage when an operation of the inverter system has started and a preset time passes.

Here, the preset time may be a time at which an overcurrent (a surge-like current) is decreased or may be a start time at which the overcurrent is not occurred, wherein the overcurrent flows at the inverter system due to a power input at a time when an operation of the inverter system starts.

That is, the preset time may be a time for controlling the relay 12a to be turned off so as to decrease an overcurrent that is generated at an initial operation in the inverter system.

The variation value calculation unit 140 may receive the first charging voltage and the second charging voltage which are measured from the voltage measurement unit 130, and may calculate a voltage difference between the first charging voltage and the second charging voltage as a variation value of a charging voltage of the DC link capacitor 12c.

Here, the variation value of the charging voltage of the DC link capacitor 12c may be a voltage value obtained by subtracting the second charging voltage, which is charged at the DC link capacitor 12c after the operation start of the inverter system and the preset time passes, from the first charging voltage which is charged at the DC link capacitor 12c before the operation start of the inverter system.

At this point, the variation value calculation unit 140 may calculate the variation value of the charging voltage of the DC link capacitor 12c using the following Equation 1.

$$\Delta V_{dc} = V_{dc1} - V_{dc2}$$ [Equation 1]

Here, $\Delta V_{dc}$ is a variation value of a charging voltage of the DC link capacitor 12c, $V_{dc1}$ is a first charging voltage charged at the DC link capacitor 12c before the operation start of the inverter system, and $V_{dc2}$ is a second charging voltage charged at the DC link capacitor 12c after the operation start of the inverter system and the preset time.

The charging voltage determination unit 150 may determine whether or not a variation value of a charging voltage of the DC link capacitor 12c according to an operation start of the inverter system exceeds a reference variation value.

Here, the reference variation value may be a voltage value that is a reference in determining whether a variation value of a charging voltage of the DC link capacitor 12c is a variation value when the relay 12a operates normally or when the relay 12a is malfunctioned.

Such a reference variation value may be calculated from the reference variation value calculation unit 160.

The reference variation value calculation unit 160 may calculate a reference variation value using a resistance value of the relay resistor 12b and a current value flowing at the relay resistor 12b.

The variation value calculation unit 160 may calculate the reference variation value using the following Equation 2.

$$V_{ref} = I_r \times R \times M$$ [Equation 2]

Here, $V_{ref}$ is a reference variation value, $I_r$ is a current value of a current flowing at the relay resistor 12b, R is a resistance value of the relay resistor 12b, and M is a correction factor.

Here, the correction factor may be a variation value of a charging voltage of the DC link capacitor 12c when the relay 12a operates normally.

Meanwhile, a meaning of a relationship between the variation value and the reference variation value which are described above will be described in detail.

As described above, in an initial stage at which an operation of the inverter system starts, electric power is input to the inverter system such that an overcurrent (a surge-like current) flows thereinto.

In order to prevent the burning of the inverter system due to such an overcurrent, the relay resistor 12b is connected to the DC link capacitor 12c and the relay 12a is connected in parallel to the relay resistor 12b.

In an initial stage at which an operation of the inverter system starts, the relay 12a is controlled to be turned off, thereby preventing an overcurrent from flowing in the DC link capacitor 12c and the inverter unit 13.

Through such an operation, an input current of the inverter system flows to the DC link capacitor 12c and the inverter unit 13 via the relay resistor 12b.

Thereafter, when the operation of the inverter system starts and after a preset time, the relay 12a is controlled to be turned on such that the input current of the inverter system flows to the DC link capacitor 12c and the inverter unit 13 without via the relay resistor 12b.

At this point, the input current flows at the relay resistor 12b to cause a voltage drop when the relay 12a is controlled to be turned off, whereas, when the relay 12a is controlled to be turned on, the input current does not flow at the relay resistor 12b and thus a voltage drop is not generated.

Consequently, by comparing a charging voltage of the DC link capacitor 12c when the relay 12a is controlled to be turned off with that of the DC link capacitor 12c when the relay 12a is controlled to be turned on, the charging voltage of the DC link capacitor 12c when the relay 12a is controlled to be turned on may be higher.

Therefore, when the relay 12a, which should be controlled to be turned on, is malfunctioned to be turned off after the operation of the inverter system starts and the preset time passes, a charging voltage of the DC link capacitor 12c may have a voltage value more less than that of the DC link capacitor 12c when the relay 12a operates normally.

The malfunction determination unit 170 may determine whether or not the relay 12a is malfunctioned based on one or more determination results whether or not the relay resistor 12b is overheated, and whether or not a variation value of a charging voltage of the DC link capacitor 12c exceeds a preset reference variation value.

More particularly, the malfunction determination unit 170 may determine that the relay 12a is malfunctioned when the temperature determination unit 120 determines that the relay resistor 12b is overheated, and the charging voltage determination unit 150 determines that the variation value of the charging voltage of the DC link capacitor 12c exceeds the preset reference variation value.

Through such an operation, the malfunction determination unit 170 may decrease an error which is generated when malfunction of the relay 12a is determined using only one of the resistance temperature of the relay resistor 12b and the variation value of the charging voltage of the DC link capacitor 12c.

For example, the malfunction determination unit 170 may prevent a detection delay of malfunction due to a time consumed for rising in temperature when the resistance temperature of the relay resistor 12b is used only.

When the malfunction determination unit 170 determines that the relay 12a is malfunctioned, the notification unit 180 may notify the control unit 14 of the inverter system 10, or a manager thereof of the determination result.

For this purpose, the notification unit 180 may notify the malfunction of the relay 12a using one or more of a sound, an image, a character, and a symbol through an output part.

Figure 6:
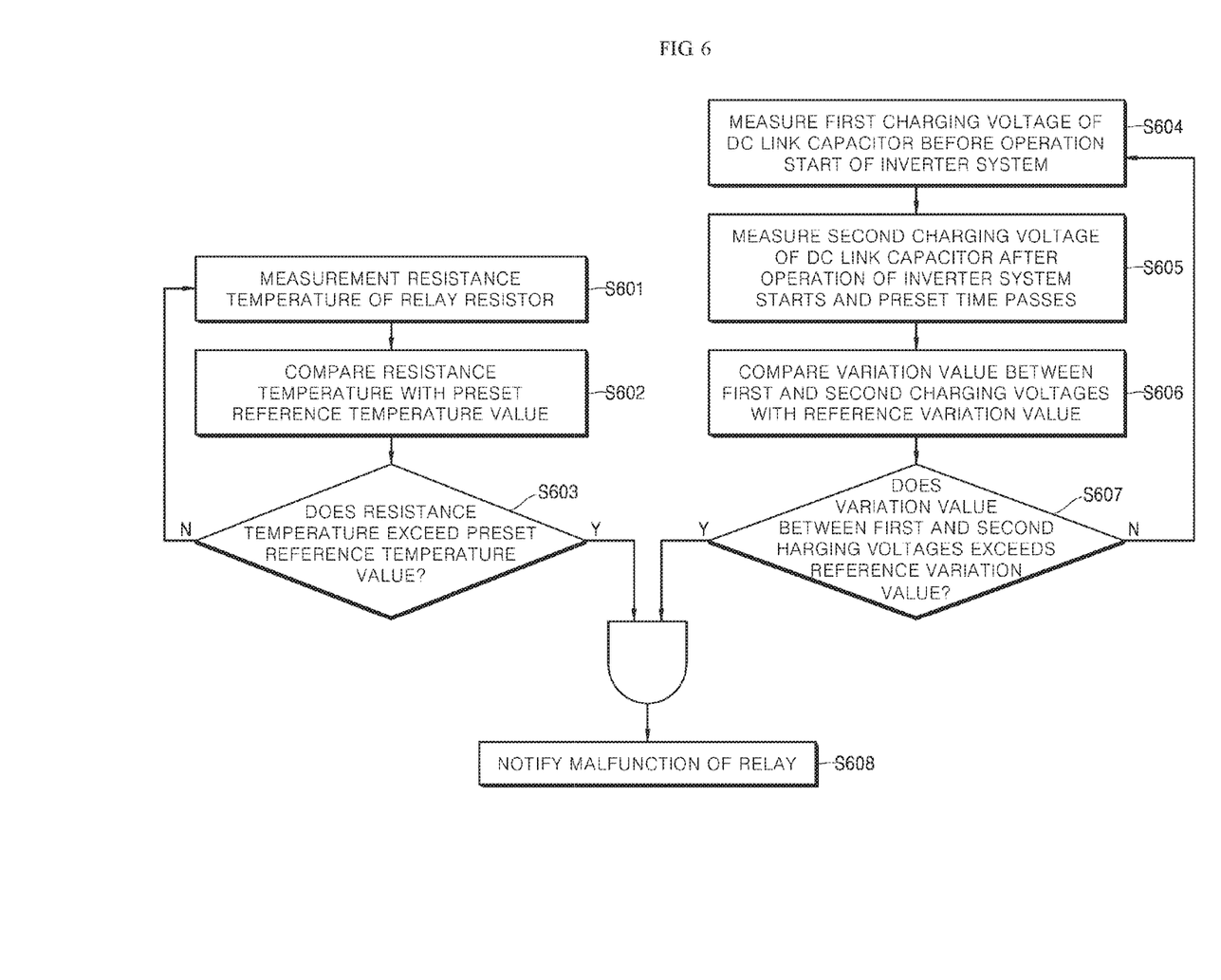
FIG. 6 is a flow chart illustrating a process of detecting malfunction of a relay using the apparatus for detecting malfunction of a relay according to one embodiment of the present disclosure.

FIG. 6 is a flow chart illustrating a process of detecting malfunction of a relay using the apparatus for detecting malfunction of a relay according to one embodiment of the present disclosure.

With reference to FIG. 6, the temperature measurement unit 110 measures a resistance temperature rising at the relay resistor 12b due to a current flowing thereon in Operation S601.

The temperature determination unit 120 compares the resistance temperature of the relay resistor 12b, which is measured from the temperature measurement unit 110, with a preset reference temperature value in Operation S602.

The temperature determination unit 120 determines that the relay resistor 12b is not overheated when the resistance temperature does not exceed the preset reference temperature value as the comparison result of the resistance temperature and the preset reference temperature value in Operation S603. Contrarily, the temperature determination unit 120 determines that the relay resistor 12b is overheated when the resistance temperature exceeds the preset reference temperature value in Operation S603.

Here, the determination result whether or not the relay resistor 12b is overheated is transmitted to the malfunction determination unit 170.

Meanwhile, before an operation of the inverter system starts, that is, when the inverter system is not operating, the voltage measurement unit 130 measures a charging voltage of the DC link capacitor 12c as a first charging voltage in Operation S604.

Next, after the operation of the inverter system starts and a preset time passes, the voltage measurement unit 130 measures a charging voltage of the DC link capacitor 12c as a second charging voltage in Operation S605.

The charging voltage determination unit 150 compares a variation value between the first and second charging voltages of the DC link capacitor 12c according to the operation start of the inverter system with a preset reference variation value in Operation S606.

The charging voltage determination unit 150 transmits a determination result to the malfunction determination unit 170 when the variation value exceeds the reference variation value as a comparison result of the variation value between the first and second charging voltages of the DC link capacitor 12c according to the operation start of the inverter system and the preset reference variation value in Operation S607.

When the temperature determination unit 120 determines that the relay resistor 12b is overheated, and the charging voltage determination unit 150 determines that the variation value of the charging voltage of the DC link capacitor 12c exceeds the preset reference variation value, the malfunction determination unit 170 determines that the relay 12a is malfunctioned in Operation S608. Also, the malfunction determination unit 170 notifies the control unit 14 of the inverter system 10 or a manager thereof of the malfunction through the notification unit 180 in Operation S608.

Although the present disclosure has been described with reference to the embodiments, it should be understood that numerous other substitutions, modifications and alterations can be devised by those skilled in the art without departing the technical spirit of this disclosure, and thus it should be construed that the present disclosure is not limited by the embodiments described above and the accompanying drawings.

What is claimed is:

1. An apparatus for detecting a malfunction of a relay, which detects the malfunction of the relay connected to a direct current (DC) link capacitor so as to block an overcurrent being generated when an operation of an inverter system starts, comprising:
   a temperature determination unit configured to determine whether a relay resistor is overheated as a first determination result based on a resistance temperature value of the relay resistor being connected to the relay;
   a charging voltage determination unit configured to determine whether a variation value of a charging voltage of the DC link capacitor according to the operation start of the inverter system exceeds a reference variation value as a second determination result; and
   a relay malfunction determination unit configured to determine whether the relay is malfunctioned based on the first and second determination results, wherein a malfunction is determined when the relay resistor is overheated and the variation value of the charging voltage exceeds the reference variation value.

2. The apparatus of claim 1, wherein the temperature determination unit determines that the relay resistor is overheated when the resistance temperature value exceeds a preset reference temperature value.

3. The apparatus of claim 1, further comprising:
   a variation value calculation unit configured to calculate a voltage difference between a first charging voltage of the DC link capacitor before the operation of the inverter system starts and a second charging voltage of the DC link capacitor after the operation of the inverter system starts and a preset time passes as the variation value of the charging voltage of the DC link capacitor.

4. The apparatus of claim 1, further comprising:
   a reference variation value calculation unit configured to calculate the reference variation value using the resistance value of the relay resistor and a current value of a current flowing at the relay resistor,
   wherein the reference variation value calculation unit calculates the reference variation value using the following Equation:

$$V_{ref} = I_r \times R \times M$$

wherein $V_{ref}$ is the reference variation value, $I_r$ is the current value of the current flowing at the relay resistor, R is the resistance value of the relay resistor, and M is a correction factor.

5. The apparatus of claim 1, further comprising:
   a temperature measurement unit configured to measure the resistance temperature of the relay resistor using a negative temperature coefficient (NTC) thermistor, wherein a resistance value of the NTC thermistor is varied in response to variation of an ambient temperature; and
   a voltage measurement unit configured to measure the charging voltage of the DC link capacitor.

6. The apparatus of claim 1, further comprising:
   a notification unit configured to notify the determination result of the malfunction determination unit.

7. The apparatus of claim 1, wherein the relay resistor is connected in parallel to the relay that is connected to the DC link capacitor.

8. An inverting system, comprising:
   a converter unit configured to convert alternating current power from the electric supply into direct current power;

a direct current link unit configured to store the direct current power converted from the converter unit;

an inverter unit configured to convert the direct current power from the direct current link unit into the alternating current power;

a relay connected to a direct current link capacitor to block an overcurrent; and a malfunction detecting apparatus which detects a malfunction of the relay connected to a direct current (DC) link capacitor so as to block an overcurrent being generated when an operation of an inverter system starts, including:

a temperature determination unit configured to determine whether a relay resistor is overheated as a first determination result based on a resistance temperature value of the relay resistor being connected to the relay;

a charging voltage determination unit configured to determine whether a variation value of a charging voltage of the DC link capacitor according to the operation start of the inverter system exceeds a reference variation value as a second determination result; and a relay malfunction determination unit configured to determine whether the relay is malfunctioned based on the first and second determination results, wherein a malfunction is determined when the relay resistor is overheated and the variation value of the charging voltage exceeds the reference variation value.

9. The apparatus of claim 8, wherein the temperature determination unit determines that the relay resistor is overheated when the resistance temperature value exceeds a preset reference temperature value.

10. The apparatus of claim 8, further comprising:
a variation value calculation unit configured to calculate a voltage difference between a first charging voltage of the DC link capacitor before the operation of the inverter system starts and a second charging voltage of the DC link capacitor after the operation of the inverter system starts and a preset time passes as the variation value of the charging voltage of the DC link capacitor.

11. The apparatus of claim 8, further comprising:
a reference variation value calculation unit configured to calculate the reference variation value using the resistance value of the relay resistor and a current value of a current flowing at the relay resistor, wherein the reference variation value calculation unit calculates the reference variation value using the following Equation:

$$V_{ref} = I_r \times R \times M$$

wherein $V_{ref}$ is the reference variation value, $I_r$ is the current value of the current flowing at the relay resistor, R is the resistance value of the relay resistor, and M is a correction factor.

12. The apparatus of claim 8, further comprising:
a temperature measurement unit configured to measure the resistance temperature of the relay resistor using a negative temperature coefficient (NTC) thermistor, wherein a resistance value of the NTC thermistor is varied in response to variation of an ambient temperature; and a voltage measurement unit configured to measure the charging voltage of the DC link capacitor.

13. The apparatus of claim 8, further comprising:
a notification unit configured to notify the determination result of the malfunction determination unit.

14. The apparatus of claim 8, wherein the relay resistor is connected in parallel to the relay that is connected to the DC link capacitor.

* * * * *